(12) United States Patent
Banin et al.

(10) Patent No.: US 11,991,265 B2
(45) Date of Patent: May 21, 2024

(54) METHODS AND DEVICES FOR ASYMMETRIC FREQUENCY SPREADING

(71) Applicant: Intel Corporation, Santa Clara, CA (US)

(72) Inventors: Elan Banin, Raanana (IL); Evgeny Shumaker, Nesher (IL); Ofir Degani, Haifa (IL); Rotem Banin, Even Yehuda (IL); Shahar Gross, Nes-Tziona (IL)

(73) Assignee: Intel Corporation, Santa Clara, CA (US)

( * ) Notice: Subject to any disclaimer, the term of this patent is extended or adjusted under 35 U.S.C. 154(b) by 382 days.

(21) Appl. No.: 17/481,357

(22) Filed: Sep. 22, 2021

(65) Prior Publication Data

US 2022/0200782 A1 Jun. 23, 2022

(30) Foreign Application Priority Data

Dec. 22, 2020 (EP) .................................... 20216333

(51) Int. Cl.
*H04L 27/22* (2006.01)
*H03C 3/06* (2006.01)
*H04B 1/04* (2006.01)
*H04L 7/033* (2006.01)
*H04L 27/152* (2006.01)

(52) U.S. Cl.
CPC ............. *H04L 7/0331* (2013.01); *H03C 3/06* (2013.01); *H04L 7/0332* (2013.01); *H04L 27/152* (2013.01); *H04L 27/22* (2013.01)

(58) Field of Classification Search
CPC ....... H04L 7/0331; H04L 27/14; H04L 27/22; H04L 27/152; H04B 1/04; H04B 1/0475; H04B 2001/044; H03C 3/06
See application file for complete search history.

(56) References Cited

U.S. PATENT DOCUMENTS

2014/0105343 A1* 4/2014 Mayer .................. H03C 3/0975
375/371
2015/0188583 A1 7/2015 Ravi et al.
2015/0381214 A1 12/2015 Tertinek et al.
2022/0029650 A1 1/2022 Banin et al.

FOREIGN PATENT DOCUMENTS

WO 2018118226 A1 6/2018

OTHER PUBLICATIONS

European Search Report issued for the corresponding European Application No. 20 21 6333, dated May 27, 2021, 1 page (for informational purposes only).

* cited by examiner

Primary Examiner — Blane J Jackson
(74) Attorney, Agent, or Firm — Viering, Jentschura & Partner mbB (57) ABSTRACT

A wireless communication device for asymmetrical frequency spreading including a processor configured to receive a frequency band message comprising a maximum difference and a minimum difference, wherein the maximum difference is between a maximum frequency of a sub-band and a signal frequency, and wherein the minimum difference is between the minimum frequency of the sub-band and the signal frequency compare the maximum difference and the minimum difference with each other; and generate a frequency shift based on the comparison.

20 Claims, 4 Drawing Sheets

METHODS AND DEVICES FOR ASYMMETRIC FREQUENCY SPREADING

CROSS-REFERENCE TO RELATED APPLICATIONS

This application claims priority to EP Application 20 216 333.3, which was filed on Dec. 22, 2020, the entire contents of which are incorporated by reference herein in their entirety.

TECHNICAL FIELD

Various aspects generally relate to methods and devices for correcting phase errors with a frequency spread offset.

BACKGROUND

Transmitting a signal may incur impairments when converting a digital signal to a radio frequency signal before transmission. For example, Digital-to-Time convertors may introduce both static and dynamic phase errors through phase modulation to phase modulation or phase modulation to amplitude modulation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and aspects of embodiments in which the disclosure may be practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "reduced subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

As used herein, "memory" is understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" refers to any type of executable instruction, including firmware.

The term "terminal device" utilized herein refers to user-side devices (both portable and fixed) that can connect to a core network and/or external data networks via a radio access network. "Terminal device" can include any mobile or immobile wireless communication device, including User Equipments (UEs), Mobile Stations (MSs), Stations (STAs), cellular phones, tablets, laptops, personal computers, wearables, multimedia playback and other handheld or body-mounted electronic devices, consumer/home/office/commercial appliances, vehicles, and any other electronic device capable of user-side wireless communications.

The term "network access node" as utilized herein refers to a network-side device that provides a radio access network with which terminal devices can connect and exchange information with a core network and/or external data networks through the network access node. "Network access nodes" can include any type of base station or access point, including macro base stations, micro base stations, NodeBs, evolved NodeBs (eNBs), gNodeBs, Home base stations, Remote Radio Heads (RRHs), relay points, Wi-Fi/WLAN Access Points (APs), Bluetooth master devices, DSRC RSUs, terminal devices acting as network access nodes, and any other electronic device capable of network-side wireless communications, including both immobile and mobile devices (e.g., vehicular network access nodes, moving cells, and other movable network access nodes). As used herein, a "cell" in the context of telecommunications may be understood as a sector served by a network access node. Accordingly, a cell may be a set of geographically co-located antennas that correspond to a particular sectorization of a network access node. A network access node can thus serve one or more cells (or sectors), where the cells are characterized by distinct communication channels.

The term "accumulator" as utilized herein refers to a an integrator configured to integrate frequency offset commands with the phase modulation values. These values are then subtracted from the phase modulation values (digital-to-time converter codes) issued by the digital front end (DFE). The digital-to-time converter (DTC) codes include a phase shift which should be applied to the constant frequency. The integration of frequency offset commands yields phase modulation commands which are subtracted from the desired phase modulation commands issued by the DFE.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. For purposes of this disclosure, radio communication technologies may be classified as one of a Short Range radio communication technology or Cellular Wide Area radio communication technology. Short Range radio communication technologies may include Bluetooth, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UMTS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMax), 5G New Radio (NR), for example, and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the wireless transmission of radio signals) and logical transmission (e.g., the transmission of digital data over a logical software-level connection). For example, a processor (or controller or physical layer) may transmit or receive data over a software-level connection with another processor (or controller or physical layer) in the form of radio signals, where the physical transmission and reception is handled by radio-layer components such as RF transceivers and antennas, and the logical transmission and reception over the software-level connection is performed by the processors.

Many wireless communication technologies use beamforming to increase link strength between transmitter and receiver. The Third Generation Partnership Project's (3GPP) Fifth Generation (5G) New Radio (NR) standard, for example, includes mechanisms for beamforming in both the transmit and receive directions. Focusing on the terminal side, a terminal device (e.g., a UE) may identify a receive antenna beam and a transmit antenna beam for a given network access node (e.g., gNodeB). In the receive direction, the terminal device can then increase link strength by receiving signals from the network access node with the receive antenna beam. Similarly, in the transmit direction the terminal device can boost link strength by transmitting signals to the network access node with the transmit antenna beam.

Polar phase modulators inevitably introduce phase modulation errors. Through various types of calibrations these errors may be reduced but not eliminated completely. Frequency spreading spectrally shapes the phase errors due to residual impairments of the phase modulator by shifting the digital phase locked loop and compensating for the shift in signal frequency in the phase modulator. The required shift in signal frequency introduces constraints on a digitally controlled oscillator. For example, the shift in signal frequency may require the digitally controlled oscillator to include large sub-bands to accommodate wide modulation bandwidth additionally to the bandwidth requirements stemming from environmental (such as voltage and temperature) and semiconductor manufacturing process variations.

Figure 1:
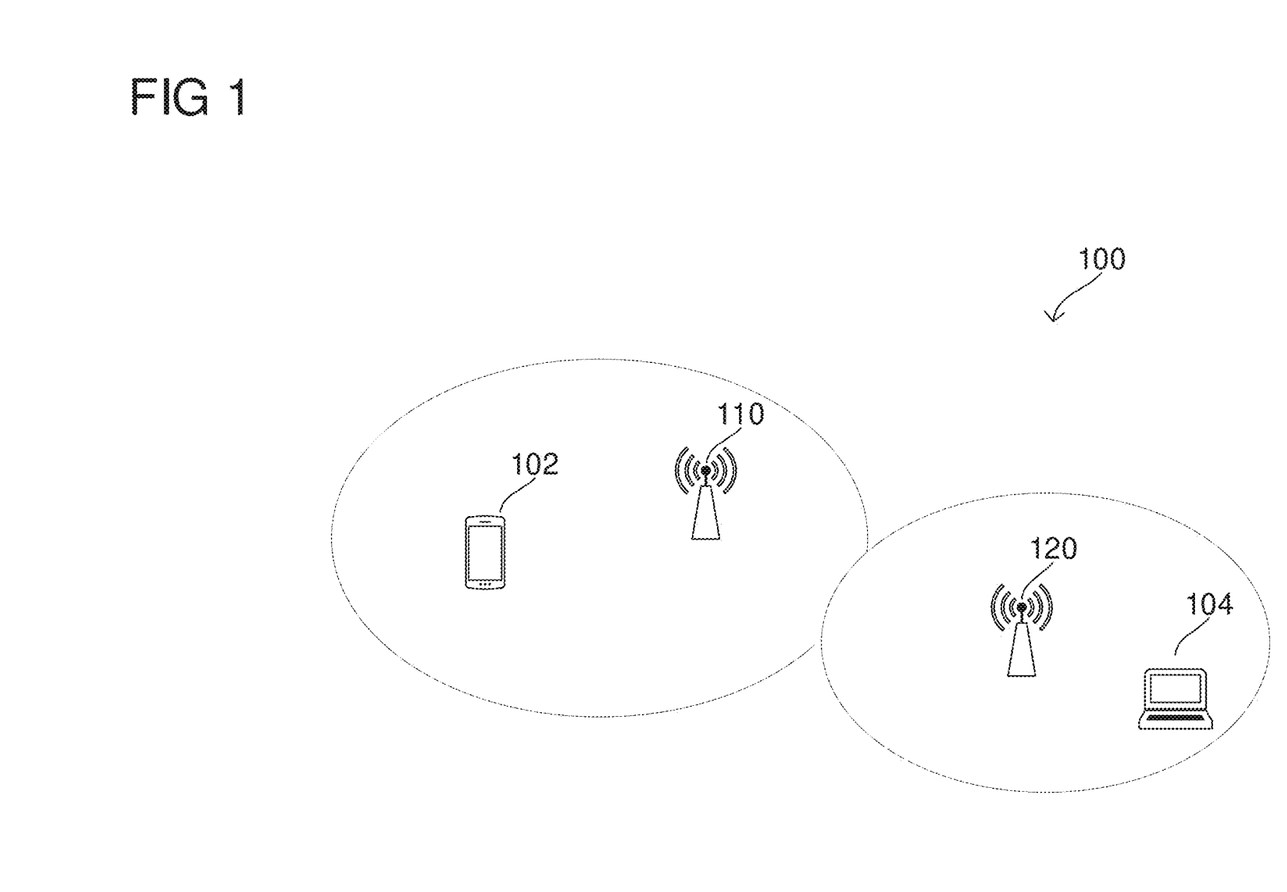
FIG. 1 shows an exemplary radio communication network according to some aspects.
Figure 2:
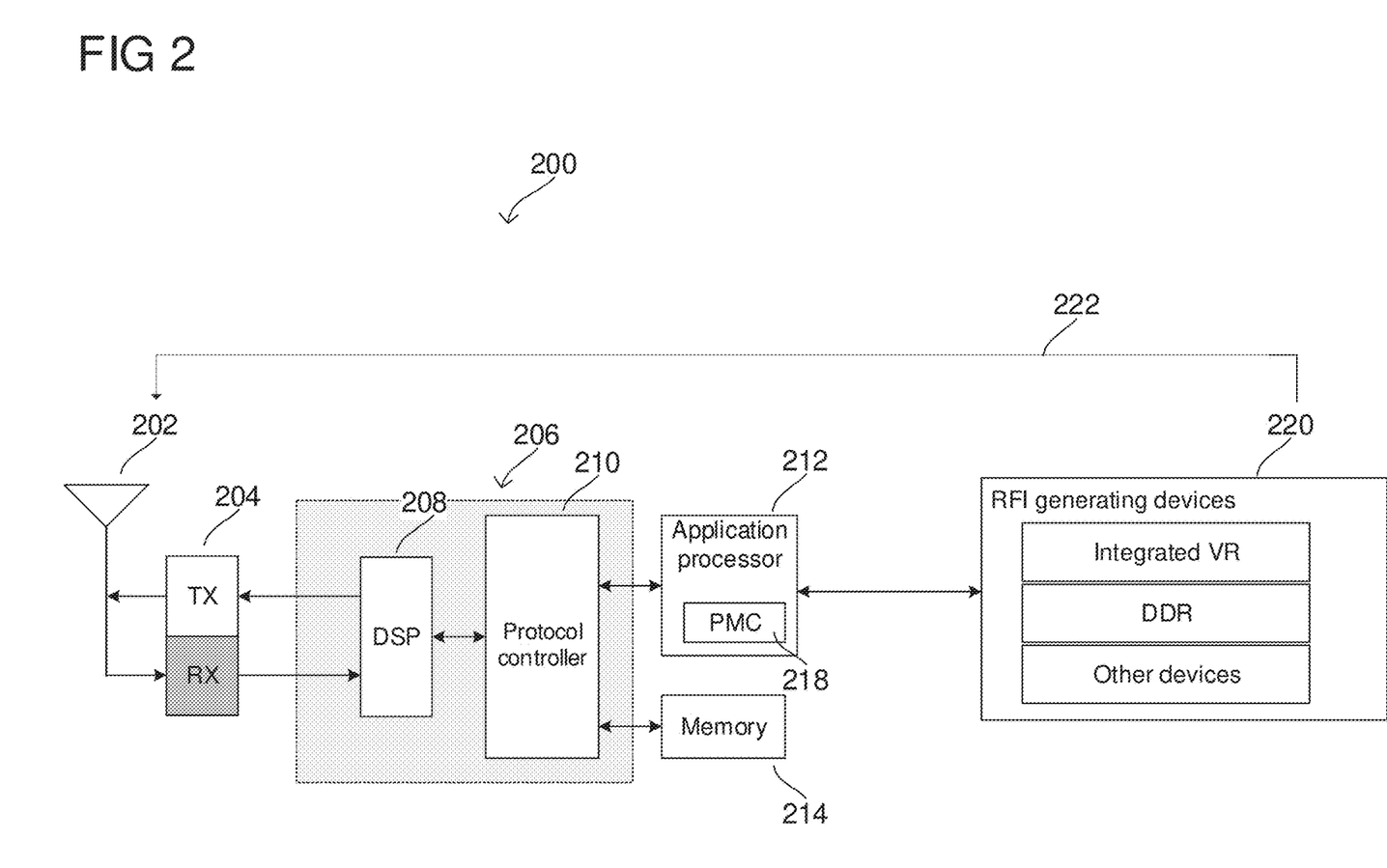
FIG. 2 shows an exemplary internal configuration of a terminal device according to some aspects.

FIGS. 1 and 2 depict a general network and device architecture for wireless communications. FIG. 1 shows exemplary radio communication network 100 according to some aspects, which may include terminal devices 102 and 104 and network access nodes 110 and 120. Radio communication network 100 may communicate with terminal devices 102 and 104 via network access nodes 110 and 120 over a radio access network. Although certain examples described herein may refer to a particular radio access network context (e.g., LTE, UMTS, GSM, other 3rd Generation Partnership Project (3GPP) networks, WLAN/Wi-Fi, Bluetooth, 5G NR, mmWave, WiGig, etc.), these examples are illustrative and may be readily applied to any other type or configuration of radio access network. The number of network access nodes and terminal devices in radio communication network 100 is exemplary and is scalable to any amount.

In an exemplary short-range context, network access node 110 and 120 may be access points (APs, e.g., WLAN or Wi-Fi APs), while terminal device 102 and 104 may be short range terminal devices (e.g., stations (STAs)). Network access nodes 110 and 120 may interface (e.g., via an internal or external router) with one or more external data networks. In an exemplary cellular context, network access nodes 110 and 120 may be base stations (e.g., eNodeBs, NodeBs, Base Transceiver Stations (BTSs), gNodeBs, or any other type of base station), while terminal devices 102 and 104 may be cellular terminal devices (e.g., Mobile Stations (MSs), User Equipments (UEs), or any type of cellular terminal device). Network access nodes 110 and 120 may therefore interface (e.g., via backhaul interfaces) with a cellular core network such as an Evolved Packet Core (EPC, for LTE), Core Network (CN, for UMTS), or other cellular core networks, which may also be considered part of radio communication network 100. The cellular core network may interface with one or more external data networks.

Network access nodes 110 and 120 (and, optionally, other network access nodes of radio communication network 100 not explicitly shown in FIG. 1) may accordingly provide a radio access network to terminal devices 102 and 104 (and, optionally, other terminal devices of radio communication network 100 not explicitly shown in FIG. 1). In an exemplary short-range context, the radio access network provided by network access nodes 110 and 120 may provide access to internal data networks (e.g., for transferring data between terminal devices connected to radio communication network 100) and external data networks (e.g., data networks providing voice, text, multimedia (audio, video, image), and other Internet and application data). In an exemplary cellular context, the radio access network provided by network access nodes 110 and 120 may enable terminal devices 102 and 104 to wirelessly access the core network via radio communications. The core network may provide switching, routing, and transmission, for traffic data related to terminal devices 102 and 104, and may further provide access to various internal data networks (e.g., control nodes, routing nodes that transfer information between other terminal devices on radio communication network 100, etc.) and external data networks (e.g., data networks providing voice, text, multimedia (audio, video, image), and other Internet and application data).

The radio access network and core network of radio communication network 100 may be governed by communication protocols that can vary depending on the specifics of radio communication network 100. Such communication protocols may define the scheduling, formatting, and routing of both user and control data traffic through radio communication network 100, which includes the transmission and reception of such data through both the radio access and core network domains of radio communication network 100. Accordingly, terminal devices 102 and 104 and network access nodes 110 and 120 may follow the defined communication protocols to transmit and receive data over the radio access network domain of radio communication network 100, while the core network may follow the defined communication protocols to route data within and outside of the core network. Exemplary communication protocols include LTE, UMTS, GSM, WiMAX, Bluetooth, Wi-Fi, mmWave, 5G NR, and the like, any of which may be applicable to radio communication network 100.

FIG. 2 shows an exemplary internal configuration of terminal device 200 according to some aspects, which may include antenna system 202, radio frequency (RF) transceiver 204, baseband modem 206 (including digital signal processor 208 and protocol controller 210), application processor 212, and memory 214. Terminal device 200 may be any one of terminal device 102 or 104. Although not explicitly shown in FIG. 2, in some aspects terminal device 200 may include one or more additional hardware and/or software components, such as processors/microprocessors, controllers/microcontrollers, other specialty or generic hardware/processors/circuits, peripheral device(s), memory, power supply, external device interface(s), subscriber identity module(s) (SIMs), user input/output devices (display(s), keypad(s), touchscreen(s), speaker(s), external button(s), camera(s), microphone(s), etc.), or other related components.

Terminal device 102 may transmit and receive radio signals on one or more radio access networks. Baseband modem 206 may direct such communication functionality of terminal device 200 according to the communication protocols associated with each radio access network, and may execute control over antenna system 202 and RF transceiver 204 to transmit and receive radio signals according to the formatting and scheduling parameters defined by each communication protocol. Although various practical designs may include separate communication components for each supported radio communication technology (e.g., a separate antenna, RF transceiver, digital signal processor, and controller), for purposes of conciseness the configuration of terminal device 200 shown in FIG. 2 depicts only a single instance of such components.

Terminal device 200 may transmit and receive wireless signals with antenna system 202. Antenna system 202 may be a single antenna or may include one or more antenna arrays that each include multiple antenna elements. For example, antenna system 202 may include an antenna array at the top of terminal device 200 and a second antenna array at the bottom of terminal device 200. In some aspects, antenna system 202 may additionally include analog antenna combination and/or beamforming circuitry. In the receive (RX) path, RF transceiver 204 may receive analog radio frequency signals from antenna system 202 and perform analog and digital RF front-end processing on the analog radio frequency signals to produce digital baseband samples (e.g., In-Phase/Quadrature (IQ) samples) to provide to baseband modem 206. RF transceiver 204 may include analog and digital reception components including amplifiers (e.g., Low Noise Amplifiers (LNAs)), filters, RF demodulators (e.g., RF IQ demodulators)), and analog-to-digital converters (ADCs), which RF transceiver 204 may utilize to convert the received radio frequency signals to digital baseband samples. In the transmit (TX) path, RF transceiver 204 may receive digital baseband samples from baseband modem 206 and perform analog and digital RF front-end processing on the digital baseband samples to produce analog radio frequency signals to provide to antenna system 202 for wireless transmission. RF transceiver 204 may thus include analog and digital transmission components including amplifiers (e.g., Power Amplifiers (PAs), filters, RF modulators (e.g., RF IQ modulators), and digital-to-analog converters (DACs), which RF transceiver 204 may utilize to mix the digital baseband samples received from baseband modem 206 and produce the analog radio frequency signals for wireless transmission by antenna system 202. In some aspects baseband modem 206 may control the radio transmission and reception of RF transceiver 204, including specifying the transmit and receive radio frequencies for operation of RF transceiver 204.

As shown in FIG. 2, baseband modem 206 may include digital signal processor 208, which may perform physical layer (PHY, Layer 1) transmission and reception processing to, in the transmit path, prepare outgoing transmit data provided by protocol controller 210 for transmission via RF transceiver 204, and, in the receive path, prepare incoming received data provided by RF transceiver 204 for processing by protocol controller 210. Digital signal processor 208 may be configured to perform one or more of error detection, forward error correction encoding/decoding, channel coding and interleaving, channel modulation/demodulation, physical channel mapping, radio measurement and search, frequency and time synchronization, antenna diversity processing, power control and weighting, rate matching/dematching, retransmission processing, interference cancelation, and any other physical layer processing functions. Digital signal processor 208 may be structurally realized as hardware components (e.g., as one or more digitally-configured hardware circuits or FPGAs), software-defined components (e.g., one or more processors configured to execute program code defining arithmetic, control, and I/O instructions (e.g., software and/or firmware) stored in a non-transitory computer-readable storage medium), or as a combination of hardware and software components. In some aspects, digital signal processor 208 may include one or more processors configured to retrieve and execute program code that defines control and processing logic for physical layer processing operations. In some aspects, digital signal processor 208 may execute processing functions with software via the execution of executable instructions. In some aspects, digital signal processor 208 may include one or more dedicated hardware circuits (e.g., ASICs, FPGAs, and other hardware) that are digitally configured to specifically execute processing functions, where the one or more processors of digital signal processor 208 may offload certain processing tasks to these dedicated hardware circuits, which are known as hardware accelerators. Exemplary hardware accelerators can include Fast Fourier Transform (FFT) circuits and encoder/decoder circuits. In some aspects, the processor and hardware accelerator components of digital signal processor 208 may be realized as a coupled integrated circuit.

Terminal device 200 may be configured to operate according to one or more radio communication technologies. Digital signal processor 208 may be responsible for lower-layer processing functions (e.g. Layer 1/PHY) of the radio communication technologies, while protocol controller 210 may be responsible for upper-layer protocol stack functions (e.g., Data Link Layer/Layer 2 and/or Network Layer/Layer 3). Protocol controller 210 may thus be responsible for controlling the radio communication components of terminal device 200 (antenna system 202, RF transceiver 204, and digital signal processor 208) in accordance with the communication protocols of each supported radio communication technology, and accordingly may represent the Access Stratum and Non-Access Stratum (NAS) (also encompassing Layer 2 and Layer 3) of each supported radio communication technology. Protocol controller 210 may be structurally embodied as a protocol processor configured to execute protocol stack software (retrieved from a controller memory) and subsequently control the radio communication components of terminal device 200 to transmit and receive communication signals in accordance with the corresponding protocol stack control logic defined in the protocol software. Protocol controller 210 may include one or more processors configured to retrieve and execute program code that defines the upper-layer protocol stack logic for one or more radio communication technologies, which can include Data Link Layer/Layer 2 and Network Layer/Layer 3 functions. Protocol controller 210 may be configured to perform both user-plane and control-plane functions to facilitate the transfer of application layer data to and from radio terminal device 200 according to the specific protocols of the supported radio communication technology. User-plane functions can include header compression and encapsulation, security, error checking and correction, channel multiplexing, scheduling and priority, while control-plane functions may include setup and maintenance of radio bearers. The program code retrieved and executed by protocol controller 210 may include executable instructions that define the logic of such functions.

Terminal device 200 may also include application processor 212 and memory 214. Application processor 212 may be a CPU, and may be configured to handle the layers above the protocol stack, including the transport and application layers. Application processor 212 may be configured to execute various applications and/or programs of terminal device 200 at an application layer of terminal device 200, such as an operating system (OS), a user interface (UI) for supporting user interaction with terminal device 200, and/or various user applications. The application processor may interface with baseband modem 206 and act as a source (in the transmit path) and a sink (in the receive path) for user data, such as voice data, audio/video/image data, messaging data, application data, basic Internet/web access data, etc. In the transmit path, protocol controller 210 may therefore receive and process outgoing data provided by application processor 212 according to the layer-specific functions of the protocol stack, and provide the resulting data to digital signal processor 208. Digital signal processor 208 may then perform physical layer processing on the received data to produce digital baseband samples, which digital signal processor may provide to RF transceiver 204. RF transceiver 204 may then process the digital baseband samples to convert the digital baseband samples to analog RF signals, which RF transceiver 204 may wirelessly transmit via antenna system 202. In the receive path, RF transceiver 204 may receive analog RF signals from antenna system 202 and process the analog RF signals to obtain digital baseband samples. RF transceiver 204 may provide the digital baseband samples to digital signal processor 208, which may perform physical layer processing on the digital baseband samples. Digital signal processor 208 may then provide the resulting data to protocol controller 210, which may process the resulting data according to the layer-specific functions of the protocol stack and provide the resulting incoming data to application processor 212. Application processor 212 may then handle the incoming data at the application layer, which can include execution of one or more application programs with the data and/or presentation of the data to a user via a user interface.

Memory 214 may be a memory circuitry or storage element of terminal device 200, such as a hard drive or another such permanent memory device. Although not explicitly depicted in FIG. 2, the various other components of terminal device 200 shown in FIG. 2 may additionally each include integrated permanent and non-permanent memory components, such as for storing software program code, buffering data, etc.

Terminal device 200 may also include RFI generating devices 220 which may be the source of RFI which interferes with the operation of integrated wireless antenna 202. The operating points of RFI generating devices may generate RFI at an operating frequency range of radio modems and then may be picked up by antenna 202 through coupling 222. Terminal device 200 may also include power management controller (PMC) 218. PMC 218 may interface and manage communication between devices of terminal device 200.

In accordance with some radio communication networks, terminal devices 102 and 104 may execute mobility procedures to connect to, disconnect from, and switch between available network access nodes of the radio access network of radio communication network 100. As each network access node of radio communication network 100 may have a specific coverage area, terminal devices 102 and 104 may be configured to select and re-select available network access nodes in order to maintain a strong radio access connection with the radio access network of radio communication network 100. For example, terminal device 102 may establish a radio access connection with network access node 110 while terminal device 104 may establish a radio access connection with network access node 120. If the current radio access connection degrades, terminal devices 102 or 104 may seek a new radio access connection with another network access node of radio communication network 100; for example, terminal device 104 may move from the coverage area of network access node 120 into the coverage area of network access node 110. As a result, the radio access connection with network access node 120 may degrade, which terminal device 104 may detect via radio measurements such as signal strength or signal quality measurements of network access node 120. Depending on the mobility procedures defined in the appropriate network protocols for radio communication network 100, terminal device 104 may seek a new radio access connection (which may be, for example, triggered at terminal device 104 or by the radio access network), such as by performing radio measurements on neighboring network access nodes to determine whether any neighboring network access nodes can provide a suitable radio access connection. As terminal device 104 may have moved into the coverage area of network access node 110, terminal device 104 may identify network access node 110 (which may be selected by terminal device 104 or selected by the radio access network) and transfer to a new radio access connection with network access node 110. Such mobility procedures, including radio measurements, cell selection/reselection, and handover are established in the various network protocols and may be employed by terminal devices and the radio access network in order to maintain strong radio access connections between each terminal device and the radio access network across any number of different radio access network scenarios.

This disclosure provides various aspects for devices and methods to calibrate frequency spreading of a signal to reduce phase related errors. Frequency spreading may require large sub-bands in the digitally controlled oscillator (DCO) to enable modulation. Additionally, the DCO may require a margin between the limits of the bandwidth and the signal modulation to reduce power sensitivity due to a receiver's expected voltage. However, large sub-bands are less accurate, inevitably increase both the phase noise and power consumption, as well as the overall design complexity of DCOs. Actively controlling the frequency spreading may reduce phase related errors without incurring the disadvantages associated with large sub-bands A signal wave may originate in a sub-band that includes a maximum frequency and a minimum frequency. The frequency of a modulated signal may approach the maximum frequency of the sub-band or the minimum frequency of the sub-band due to frequency spreading. A margin may be defined as the difference between the frequency of the signal and the maximum frequency of the sub-band or the difference between the frequency of the signal and the minimum frequency of the sub-band. Maintaining a minimum margin between the signal frequency and the limits of the sub-band may ensure proper feedback.

Figure 3:
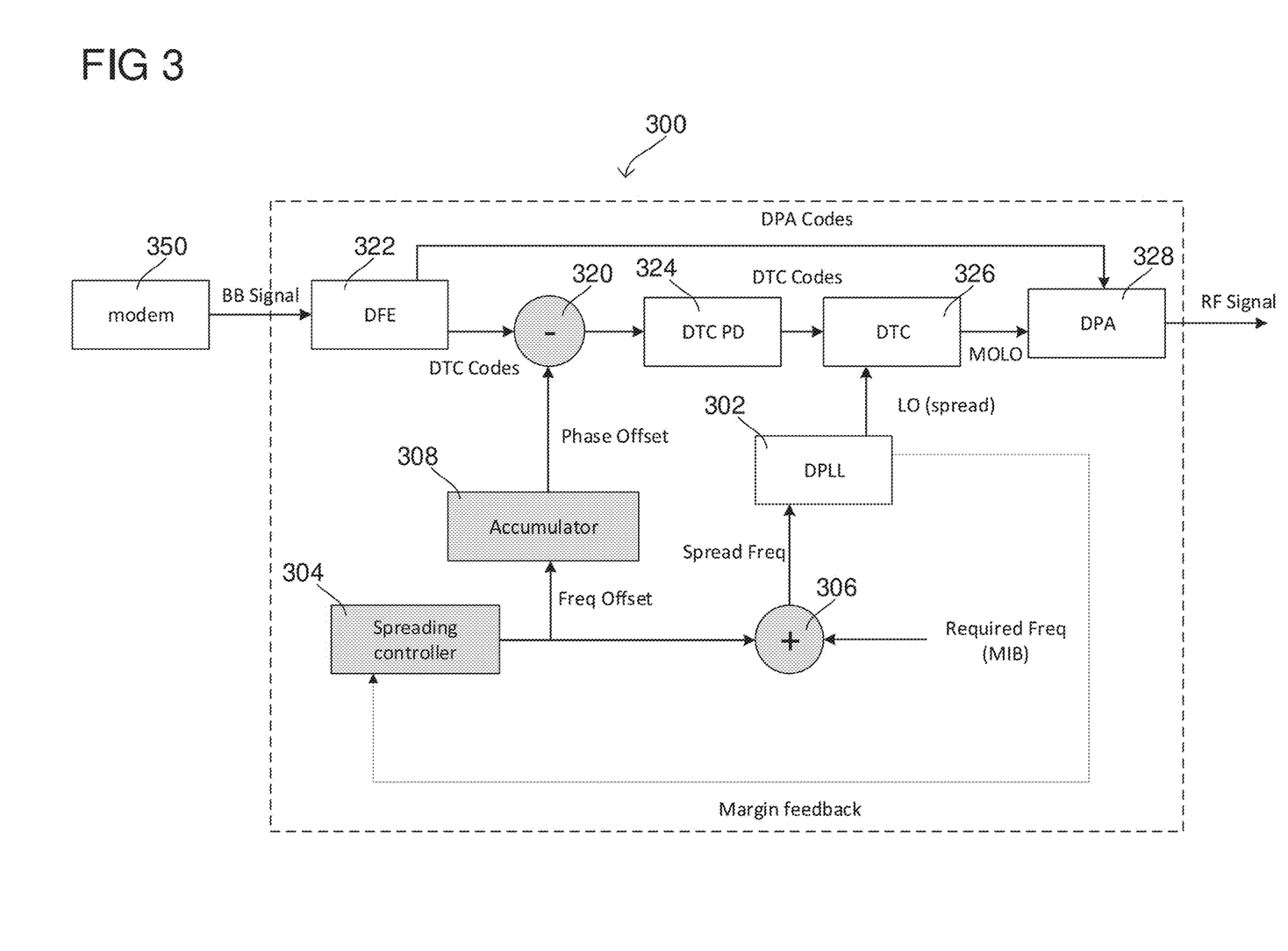
FIG. 3 shows an exemplary device for asymmetrical frequency spreading according to some aspects.

FIG. 3 shows a communication device 300 for controlling the frequency spreading according to some aspects. For example, controlling frequency spreading in a polar transmitter. Communication device 300 may receive a baseband signal from baseband modem 350. The baseband signal may be modulated according to an IQ modulation scheme. Digital front end (DFE) 322 of communication device 300 may receive the baseband signal and translate the IQ modulated baseband signal into amplitude and phase modulation commands according to a polar modulation scheme. DFE 322 sends the amplitude modulation commands to digital power amplifier (DPA) 328. DPA 328 performs amplitude modulation commands encoded into DPA codes by the DFE 322. Phase modulation commands generated by DFE 322 are encoded into DTC codes to be implemented by the digital to time converter (DTC) 326. All known realizations of the DTC are prudent to integral non-linearity (INL) distortions which are usually treated by a pre-distortion algorithm (realized within the DTC pre-distortion (PD) 324). However, no known PD algorithm eliminates the effect of the INL (which can feature both static and dynamic components) completely. The residual INL institutes a modulating information (DTC codes) dependent phase error.

Communication device 300 may include digital phase locked loop (DPLL) 302 configured to generate a frequency based on a reference source having a frequency constant. For example, a required RF transmission carrier. A digitally control oscillator (DCO) (not shown) of DPLL 302 may be digitally locked to the frequency constant. The DPLL 302 may generate a carrier wave based on a multiple of the frequency constant. For example, a multiple greater than 1. The generated carrier wave may be fed to the DTC 326. DTC 326 may expect a constant frequency from DPLL 302 based the on the fixed multiple of the reference source. In case of strongly periodic DTC codes (such as those that may occur in case of offset frequency transmissions), the phase error takes form of a periodic phase modulation. The spectral expression of this parasitic modulation is spurious in nature (strong tones of concentrated energy at discrete offsets from the RF carrier wave).

Communication device 300 may be further configured to reduce phase error (noise) and distortions. For example, to break the periodicity dictated by the DTC codes, DPLL 302 may be configured to generate a carrier wave based on a dynamic frequency (by means of modulation of the required multiple or multiplication ratio) and DTC 326 may be configured to expect a carrier wave featuring a dynamically variable frequency.

To perform the modulation of the multiplication ratio, communication device 300 may further include a frequency spreading controller 304, adder 306, accumulator 308, and subtractor 320. DPLL 302 may constantly send a digital signal representing the current (instantaneous) margin to the frequency spread controller 304 via a feedback loop between DPLL 302 and frequency spreading controller 304. Frequency spreading controller 304 may determine a frequency offset for biased modulation based on the received margin information from DPLL 302. For example, if the signal maximum frequency is approaching the sub-band maximum frequency ($f_{max}$), the spreading controller 304 may determine a frequency offset toward the minimum frequency of the sub-band. Frequency spreading controller 304 may send frequency offset command to adder 306. Adder 306 may add the frequency offset to the required frequency thereby ordering frequency spreading within the DPLL 302. This changes the frequency of carrier wave DPLL 302 generates and sends to DTC 326. Frequency spreading controller 304 also sends the frequency offset to accumulator 308 to generate a phase offset based on the frequency offset. Accumulator 308 may be a numeral integrator configured to integrate the frequency offset from controller 304 over time to generate the phase offset. Accumulator 308 sends the phase offset to subtractor 320 to subtract phase offset from the original DTC codes (which convey phase modulation commands). Subtractor 320 receives the original DTC codes from DFE 322 and phase offset from accumulator 308 and forwards the compensated DTC codes to DTC PD 324. DTC PD 324 executes a pre-distortion algorithm on the compensated codes and forwards the compensated and pre-distorted DTC codes to DTC 326. DTC 326 receives the compensated and pre-distorted DTC codes and the local oscillator signal with spread frequency from DPLL 302 to create the phase modulated local oscillator (MOLO) signal. The phase modulated local oscillator signal is sent to digital power amplifier (DPA) 328 which performs amplitude modulation of the (already) phase modulated LO according to DPA codes received from the DFE 322 to complete polar modulation of the carrier signal.

The DPLL may be limited as to how much frequency spreading can be achieved. For example, how much can the local oscillator signal that the DPLL generates vary from the (unmodulated) required frequency. This is because the DCO of the DPLL can support a limited frequency variation before it approaches the bounds of the sub-band and face imminent loss of lock. The DPLL may constantly feed the margin information to the spreading controller. For example, a message may be sent to the frequency spreading controller every clock cycle. The margin limits may be digitally preset. For example, a percentage of the sub-band may be required to be maintained as a margin between the limits or bounds of the sub-band and the signal frequency.

To avoid modulating a signal that produces an insufficient margin, the frequency controller closely monitors the current margin. The frequency controller may compare the margin to a margin threshold. If the margin does not satisfy the margin threshold, the frequency controller may generate a frequency offset. For example, if there needs to be a margin of at least 10% of the sub-band frequency range between the sub-band maximum frequency and the signal frequency maximum, but the DPLL indicates only a 7% margin, the frequency controller may determine a frequency offset biased toward sub-band minimum frequency. If the DPLL indicates a margin greater than threshold, the frequency controller does not determine an offset or determines an offset of 0. The frequency spreading controller may adjust the limits of the frequency shift such that it will always shift in the direction with the largest margin.

Using the above described process, there are no added requirements on the sub-band frequency range (width) and no concerns that the frequency shift will result in a loss of lock of the DPLL.

As previously described with respect to FIG. 3, a communication device may be configured to spread the LO signal frequency generated by the DPLL and then compensate the phase modulation commands (DTC codes) for any phase shift already incurred. This may be achieved by adding an offset sequence to the DPLL frequency control word (FCW). The same offset sequence is accumulated in order to produce the phase compensation (or phase offset) which is added to the original DTC codes. Any pre-distortion algorithm, such as that aimed at integral non-linearities mitigation, may be enacted after the addition of the phase compensation to the original DTC codes.

After the DPLL is locked, a single sub-band is active and the DPLL modulates the frequency by controlling the fine-tune (FT) code inside the sub-band. The lower frequency limit and upper frequency limit of the sub-band covers the frequency range of the signal. For example, the frequency of the signal is less than the maximum frequency of the sub-band, and the frequency of the signal is greater than the minimum frequency of the sub-band.

To maintain sufficient margins, a frequency shift controller may asymmetrically spread the frequency for carrier-shift with DPLL feedback. The DPLL has the information of the momentary margin from the sub-band limits. The DPLL may notify the frequency spreading controller, and the frequency spreading controller may determine a frequency bias or modulation pattern which is biased to the side with the most margin.

For example, one might set the margins at $$f_{bot}=f_{min}+0.1\cdot(f_{max}-f_{min}) \text{ and } f_{top}=f_{max}-0.1\cdot(f_{max}-f_{min})$$

where $f_{min}$ is the minimum sub-band frequency and $f_{max}$ is the maximum sub-band frequency. Additionally, where $f_{bot}$ is the bottom margin and $f_{top}$ is the top margin. In this way, whenever the required frequency (due to intentional spreading or environmental variations) wanders outside the [$f_{bot}$, $f_{top}$] range, a newly computed bias is added to the spreading frequency so that entire modulation is once again contained within the prescribed [$f_{bot}$,$f_{top}$] range and maintains a sufficient margin.

The frequency spreading controller may use a pattern of the form:

$$f_{spreading}=f_{bias}+A_{SD}\sin(\omega_{SD}t)$$

where $f_{bias}$ is the aforementioned frequency bias, and $A_{SD}\sin(\omega_{SD}t)$ is the sinusoidal spreading pattern being applied.

The average frequency of signal generated by the DPLL should be $f_{req}+f_{bias}$. where $f_{req}$ is the frequency constant. It should be noted that the above formula constitutes an example of a possible spreading pattern and other formulas may work to achieve the results previously described.

In this way, the wireless communication device may achieve performance of an ideal spreader, such as a spread with no limits, within the frequency limits of a sub-band. The spreading in the DPLL must be compensated. The frequency spreading of the DPLL local oscillator signal must be converted to phase modulation commands and subtracted to from the phase modulation generated by the DFE. The effect is neutralization of the residual integral non-linearities in the DTC while staying firmly within the limits of a relatively small sub-band.

Figure 4:
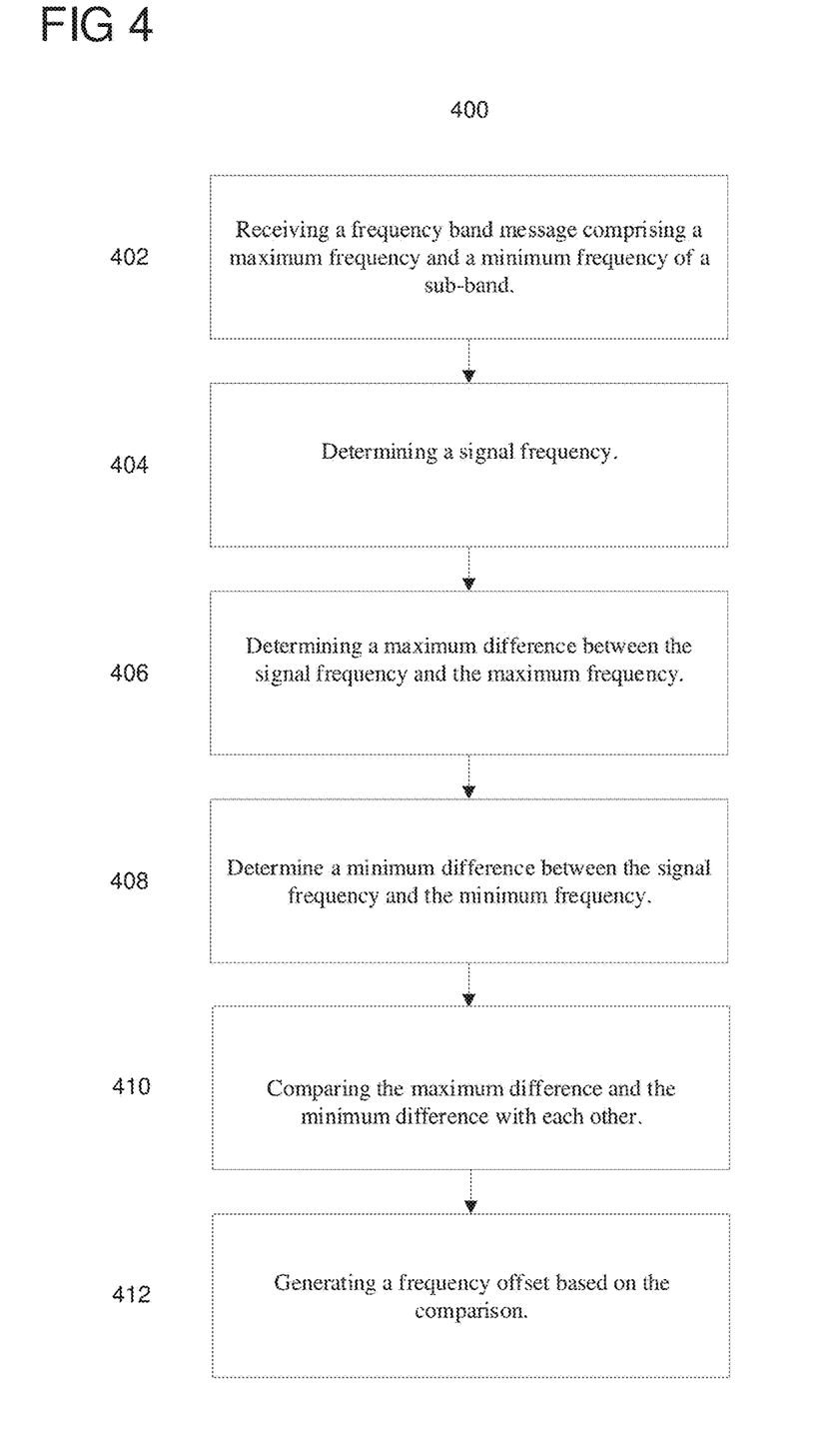
FIG. 4 shows an exemplary of method asymmetrical frequency spreading according to some aspects.

FIG. 4 illustrates an exemplary method of performing asymmetric frequency spreading according to some aspects. FIG. 4 shows exemplary method 400. As shown in FIG. 4, method 400 includes receiving a frequency band message comprising a maximum frequency and a minimum frequency of a sub-band (stage 402); determining a signal frequency (stage 404); determining a maximum difference between the signal frequency and the maximum frequency (stage 406); determining a minimum difference between the signal frequency and the minimum frequency (stage 408); comparing the maximum difference and the minimum difference with each other (stage 410); and generating a frequency offset based on the comparison (stage 412).

In the following, various aspects of the present disclosure will be illustrated:

In Example 1, a device for asymmetrical frequency spreading including one or more processors configured to receive a frequency band message comprising a maximum difference and a minimum difference, wherein the maximum difference is between a maximum frequency of a sub-band and a signal frequency, and wherein the minimum difference is between the minimum frequency of the sub-band and the signal frequency; compare the maximum difference and the minimum difference with each other; and generate a frequency shift based on the comparison.

In Example 2, the subject matter of Example 1, may optionally further include wherein the one or more processors are further configured to generate an adjustment instruction based on the frequency shift.

In Example 3, the subject matter of any one of Examples 1 or 2, may optionally further include a local oscillator configured to adjust the signal frequency based on the adjustment instruction.

In Example 4, the subject matter of any one of Examples 1 to 3, may optionally further include wherein the minimum difference is larger than the maximum difference; and the adjustment instruction comprises a shift instruction to shift the signal frequency toward the minimum frequency.

In Example 5, the subject matter of any one of Examples 1 to 4, may optionally further include wherein the maximum difference is larger than the minimum difference; and the adjustment instruction comprises a shift instruction to shift the signal frequency toward the maximum frequency.

In Example 6, the subject matter of any one of Examples 1 to 5, may optionally further include wherein the adjustment instruction comprises a centering instruction to center the signal frequency between the maximum frequency and the minimum frequency.

In Example 7, the subject matter of any one of Examples 1 to 6, may optionally further include wherein the signal frequency adjustment comprises an amplitude modulation.

In Example 8, the subject matter of any one of Examples 1 to 7, may optionally further include wherein the signal frequency adjustment comprises a phase modulation.

In Example 9, the subject matter of any one of Examples 1 to 8, may optionally further include a phase locked loop configured to determine the maximum difference and the minimum difference.

In Example 10, the subject matter of any one of Examples 1 to 9, may optionally further include wherein the frequency band message is received from the phase locked loop.

In Example 11, the subject matter of any one of Examples 1 to 10, may optionally further include a feedback loop between the phase locked loop and the device.

In Example 12, the subject matter of any one of Examples 1 to 11, may optionally further include wherein the phase locked loop is a digital phase locked loop.

In Example 13, the subject matter of any one of Examples 1 to 12 may optionally further include wherein the adjustment instruction comprises an integration of the frequency shift and a phase shift; and the integration is subtracted from an original phase shift of an input signal frequency.

In Example 14, the subject matter of any one of Examples 1 to 13, may optionally further include wherein the adjustment instruction comprises a phase modulation.

In Example 15, the subject matter of any one of Examples 1 to 14, may optionally further include wherein the adjustment instructions are integrated over time and the result of such integration subtracted from an original phase modulations commands.

In Example 16, the subject matter of any one of Examples 1 to 15, may optionally further include wherein the adjustment instruction comprises a time varying frequency modulation pattern.

In Example 17, a device for asymmetrical frequency spreading including a memory configured to store instruction; one or more processors coupled to the memory to execute the instruction stored in the memory, wherein the instructions are configured to receive a frequency band message comprising a maximum difference and a minimum difference, wherein the maximum difference is between a maximum frequency of a sub-band and a signal frequency, and wherein the minimum difference is between the minimum frequency of the sub-band and the signal frequency; compare the maximum difference and the minimum difference with each other; and generate a frequency shift based on the comparison.

In Example 18, the subject matter of Example 17, may optionally further include any one of Examples 2 to 16.

In Example 19 a device for asymmetrical frequency spreading including one or more processors configured to receive a frequency band message comprising a maximum frequency and a minimum frequency of a frequency band and a signal frequency; obtain a maximum difference between the signal frequency and the maximum frequency; obtain a minimum difference between the signal frequency and the minimum frequency; compare the maximum difference and the minimum difference with each other; and generate a frequency shift based on the comparison.

In Example 20, the subject matter of Example 19, may optionally further include wherein the one or more processors are further configured to generate an adjustment instruction based on the frequency shift.

In Example 21, the subject matter of any one of Examples 19 or 20, may optionally further include a local oscillator configured to adjust the signal frequency based on the adjustment instruction.

In Example 22, the subject matter of any one of Examples 19 to 21, may optionally further include wherein the minimum difference is larger than the maximum difference; and the adjustment instruction comprises a shift instruction to shift the signal frequency toward the minimum frequency.

In Example 23, the subject matter of any one of Examples 19 to 22, may optionally further include wherein the maximum difference is larger than the minimum difference; and the adjustment instruction comprises a shift instruction to shift the signal frequency toward the maximum frequency.

In Example 24, the subject matter of any one of Examples 19 to 23, may optionally further include wherein the adjustment instruction comprises a centering instruction to center the signal frequency between the maximum frequency and the minimum frequency.

In Example 25, the subject matter of any one of Examples 19 to 24, may optionally further include wherein the signal frequency adjustment comprises an amplitude modulation.

In Example 26, the subject matter of any one of Examples 19 to 25, may optionally further include wherein the signal frequency adjustment comprises a phase modulation.

In Example 27, the subject matter of any one of Examples 19 to 26, may optionally further include a phase locked loop configured to determine the maximum difference and the minimum difference.

In Example 28, the subject matter of any one of Examples 19 to 27, may optionally further include wherein the frequency band message is received from the phase locked loop.

In Example 29, the subject matter of any one of Examples 19 to 28, may optionally further include a feedback loop between the phase locked loop and the device.

In Example 30, the subject matter of any one of Examples 19 to 29, may optionally further include wherein the phase locked loop is a digital phase locked loop.

In Example 31, the subject matter of any one of Examples 19 to 30, may optionally further include wherein the adjustment instructions are integrated over time and the result of such integration subtracted from an original phase modulations commands.

In Example 32, the subject matter of any one of Examples 19 to 31, may optionally further include wherein the adjustment instruction comprises a time varying frequency modulation pattern.

In Example 33, a device for asymmetrical frequency spreading including a memory configured to store instruction; one or more processors coupled to the memory to execute the instruction stored in the memory, wherein the instructions are configured to receive a frequency band message comprising a maximum frequency and a minimum frequency of a frequency band and a signal frequency; obtain a maximum difference between the signal frequency and the maximum frequency; obtain a minimum difference between the signal frequency and the minimum frequency; compare the maximum difference and the minimum difference with each other; and generate a frequency shift based on the comparison.

In Example 34, the subject matter of Example 33, may optionally further include any one of Examples 19 to 32.

In Example 35, a controller for asymmetrical frequency spreading coupled to a memory configured to store instruction; one or more processors coupled to the memory to execute the instruction stored in the memory, wherein the instructions are configured to receive a frequency band message comprising a maximum frequency and a minimum frequency of a frequency band and a signal frequency from a digital phase locked loop; obtain a maximum difference between the signal frequency and the maximum frequency; obtain a minimum difference between the signal frequency and the minimum frequency; compare the maximum difference and the minimum difference with each other; and generate a frequency shift based on the comparison, wherein a local oscillator is configured to modify the signal frequency based on the frequency shift.

In Example 36 a method for asymmetrical frequency spreading including receiving a frequency band message comprising a maximum difference and a minimum difference, wherein the maximum difference is between a maximum frequency of a sub-band and a signal frequency, and wherein the minimum difference is between the minimum frequency of the sub-band and the signal frequency; comparing the maximum difference and the minimum difference with each other; and generating a frequency shift based on the comparison.

In Example 37, the subject matter of Example 36, may optionally further include generating an adjustment instruction based on the frequency shift.

In Example 38, the subject matter of any one of Examples 36 or 37, may optionally further include adjusting the signal frequency based on the adjustment instruction.

In Example 39, the subject matter of any one of Examples 36 to 38, may optionally further include the minimum difference is larger than the maximum difference; and the adjustment instruction comprises a shift instruction to shift the signal frequency toward the minimum frequency.

In Example 40, the subject matter of any one of Examples 36 to 39, may optionally further include wherein the maximum difference is larger than the minimum difference; and the adjustment instruction comprises a shift instruction to shift the signal frequency toward the maximum frequency.

In Example 41, the subject matter of any one of Examples 36 to 40, may optionally further include wherein the adjustment instruction comprises a centering instruction to center the signal frequency between the maximum frequency and the minimum frequency.

In Example 42, the subject matter of any one of Examples 36 to 41, may optionally further include wherein the signal frequency adjustment comprises an amplitude modulation.

In Example 43, the subject matter of any one of Examples 36 to 42, may optionally further include wherein the signal frequency adjustment comprises a phase modulation.

In Example 44, the subject matter of any one of Examples 36 to 43, may optionally further include wherein the frequency band message is received from a phase locked loop.

In Example 45, the subject matter of any one of Examples 36 to 44, may optionally further include wherein the adjustment instruction comprises an integration of the frequency shift and a phase shift; and the integration is subtracted from an original phase shift of an input signal frequency.

In Example 46, the subject matter of any one of Examples 36 to 45, may optionally further include wherein the adjustment instruction comprises a phase modulation.

In Example 47, the subject matter of any one of Examples 36 to 46, may optionally further include wherein the adjustment instructions are integrated over time and the result of such integration subtracted from an original phase modulations commands.

In Example 48, the subject matter of any one of Examples 36 to 47, may optionally further include wherein the adjustment instruction comprises a time varying frequency modulation pattern.

In Example 49, a system including one or more devices according to Examples 1 to 35, configured to implement a method according to Examples 36 to 47.

In Example 50, one or more non-transitory computer readable media comprising programmable instructions thereon, that when executed by one or more processors of a device, cause the device to perform any one of the method of Examples 36 to 47.

In Example 51, a means for implementing any of the Examples 1 to 35.

While the above descriptions and connected figures may depict electronic device components as separate elements, skilled persons will appreciate the various possibilities to combine or integrate discrete elements into a single element. Such may include combining two or more circuits to form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature and are thus understood as capable of being implemented in a corresponding device. Likewise, it is appreciated that implementations of devices detailed herein are understood as capable of being implemented with a corresponding method. It is thus understood that a device corresponding to a method detailed herein may include one or more components configured to perform each aspect of the related method.

All acronyms defined in the above description additionally hold in all claims included herein.

What is claimed is:

1. A device comprising:
   a processor configured to:
      receive a frequency band message comprising a maximum difference and a minimum difference, wherein the maximum difference is between a maximum frequency of a sub-band and a signal frequency, and wherein the minimum difference is between a minimum frequency of the sub-band and the signal frequency;
      compare the maximum difference and the minimum difference with each other; and
      generate a frequency shift based on the comparison.

2. The device of claim 1, wherein the processor is further configured to generate an adjustment instruction based on the frequency shift.

3. The device of claim 1, further comprising a local oscillator configured to adjust the signal frequency based on the adjustment instruction.

4. The device of claim 1, wherein the minimum difference is larger than the maximum difference; and the adjustment instruction comprises a shift instruction to shift the signal frequency toward the minimum frequency.

5. The device of claim 1, wherein the maximum difference is larger than the minimum difference; and the adjustment instruction comprises a shift instruction to shift the signal frequency toward the maximum frequency.

6. The device of claim 1, wherein the adjustment instruction comprises a centering instruction to center the signal frequency between the maximum frequency and the minimum frequency.

7. The device of claim 1, wherein the adjustment instructions are integrated over time and the result of such integration subtracted from an original phase modulation command.

8. The device of claim 1, wherein the adjustment instruction comprises a time varying frequency modulation pattern.

9. The device of claim 1, further comprising:
   a phase locked loop configured to determine the maximum difference and the minimum difference.

10. The device of claim 1, wherein the frequency band message is received from the phase locked loop.

11. The device of claim 1, further comprising a feedback loop between the phase locked loop and the device.

12. The device of claim 1, wherein the phase locked loop is a digital phase locked loop.

13. A method comprising:
receiving a frequency band message comprising a maximum difference and a minimum difference, wherein the maximum difference is between a maximum frequency of a sub-band and a signal frequency, and wherein the minimum difference is between the minimum frequency of the sub-band and the signal frequency;
comparing the maximum difference and the minimum difference with each other; and
generating a frequency shift based on the comparison.

14. The method of claim 13, further comprising generating an adjustment instruction based on the frequency shift.

15. The method of claim 13, further comprising adjusting the signal frequency based on the adjustment instruction.

16. A device for asymmetrical frequency spreading, comprising:
one or more processors configured to:
receive a frequency band message comprising a maximum frequency and a minimum frequency of a frequency band and a signal frequency; obtain a maximum difference between the signal frequency and the maximum frequency;
obtain a minimum difference between the signal frequency and the minimum frequency;
compare the maximum difference and the minimum difference with each other; and
generate a frequency shift based on the comparison.

17. The device of claim 16, wherein the one or more processors are further configured to generate an adjustment instruction based on the frequency shift.

18. The device of claim 16, further comprising a local oscillator configured to adjust the signal frequency based on the adjustment instruction.

19. The device of claim 16, wherein the minimum difference is larger than the maximum difference; and the adjustment instruction comprises a shift instruction to shift the signal frequency toward the minimum frequency.

20. The device of claim 16, wherein the maximum difference is larger than the minimum difference; and the adjustment instruction comprises a shift instruction to shift the signal frequency toward the maximum frequency.

* * * * *